(12) United States Patent
Lee

(10) Patent No.: US 9,195,541 B2
(45) Date of Patent: Nov. 24, 2015

(54) CONTROLLING NONVOLATILE MEMORY DEVICE AND NONVOLATILE MEMORY SYSTEM

(75) Inventor: Yang-Sup Lee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 251 days.

(21) Appl. No.: 13/613,906

(22) Filed: Sep. 13, 2012

(65) Prior Publication Data
US 2013/0227346 A1 Aug. 29, 2013

(30) Foreign Application Priority Data

Feb. 27, 2012 (KR) .................. 10-2012-0019748

(51) Int. Cl.
G06F 11/00 (2006.01)
G06F 11/10 (2006.01)
H03M 13/05 (2006.01)

(52) U.S. Cl.
CPC .......... *G06F 11/108* (2013.01); *G06F 11/1076* (2013.01); *G06F 2211/109* (2013.01); *H03M 13/05* (2013.01)

(58) Field of Classification Search
CPC .................................................... G06F 11/1076
See application file for complete search history.

(56) References Cited

U.S. PATENT DOCUMENTS

| 5,802,551 | A | * | 9/1998 | Komatsu et al. ............... 711/103 |
| 6,766,424 | B1 | * | 7/2004 | Wilson .......................... 711/148 |
| 8,286,028 | B2 | * | 10/2012 | Matsuda et al. .............. 714/6.24 |
| 2007/0115731 | A1 | * | 5/2007 | Hung ....................... 365/189.05 |
| 2009/0287956 | A1 | * | 11/2009 | Flynn et al. ....................... 714/6 |
| 2009/0327803 | A1 | * | 12/2009 | Fukutomi et al. ................. 714/7 |
| 2010/0262727 | A1 | * | 10/2010 | Arndt .............................. 710/22 |
| 2010/0318844 | A1 | * | 12/2010 | Matsuda et al. .................. 714/6 |
| 2011/0078496 | A1 | * | 3/2011 | Jeddeloh ...................... 714/6.24 |
| 2011/0302446 | A1 | * | 12/2011 | Becker-Szendy et al. ..... 714/6.1 |
| 2014/0089728 | A1 | * | 3/2014 | Veal et al. .................... 714/6.21 |
| 2014/0095959 | A1 | * | 4/2014 | Flynn et al. ................... 714/758 |
| 2014/0129896 | A1 | * | 5/2014 | Parthasarathy et al. ....... 714/755 |

* cited by examiner

Primary Examiner — Amine Riad
(74) Attorney, Agent, or Firm — F. Chau & Associates, LLC

(57) ABSTRACT

A method for controlling a nonvolatile memory device includes reading a sub stripe including a plurality of sub pages stored in a first region, writing data stored in valid sub pages of the sub stripe to a second region different from the first region, and generating parity data using the data written to the second region and constituting a new sub stripe.

18 Claims, 9 Drawing Sheets

<SUB PAGE = ECC CHUNK>

CONTROLLING NONVOLATILE MEMORY DEVICE AND NONVOLATILE MEMORY SYSTEM

CROSS-REFERENCE TO RELATED APPLICATION

This application claims priority from Korean Patent Application No. 10-2012-0019748, filed on Feb. 27, 2012 in the Korean Intellectual Property Office, and all the benefits accruing therefrom under 35 U.S.C. 119, the contents of which are herein incorporated by reference in their entirety.

BACKGROUND

1. Technical Field

The present disclosure relates to a method for controlling a nonvolatile memory device and a nonvolatile memory system.

2. Description of Related Art

RAID technology is typically used in storage media such as a server containing important data. RAID is an acronym for Redundant Array of Independent (or Inexpensive) Disks. In RAID devices, when an error occurs in data stored in one storage media, valid data may be recovered by using a simple parity code stored in one of various other storage media. Using a RAID device can balance input and output operations while improving the overall performance of the server.

In the case of a Solid State Drive (SSD) used as a server storage media, a semiconductor memory used in the SSD may include, for example, NAND flash memory. Since the smallest unit of the NAND flash memory that can be read or written is a page, RAID striping on a page-by-page basis may be adopted. In this case, however, data cannot be recovered using a RAID technique in the case of data errors generated in two or more pages.

SUMMARY

According to an embodiment of the present disclosure, a method for controlling a nonvolatile memory device includes reading a first sub stripe including a plurality of sub pages stored a first memory region, writing data stored in a valid sub page of the first sub stripe to a second memory region different from the first memory region, and generating parity data using the data written to the second memory region, wherein the data written to the second memory region constitutes a second sub stripe.

According to another embodiment of the present invention, a nonvolatile memory system includes a plurality of memory chips, each memory chip including a first region and a second region, and each region storing a plurality of pages, and a controller coupled to the plurality of memory chips, wherein the pages include a plurality of ECC chunks, and the controller is configured to read a sub stripe including the ECC chunks stored in the plurality of different memory chips, write data stored in valid sub pages of the sub stripe to the second region, and generate parity data using the data written to the second region and constituting a second sub stripe.

According to an embodiment of the present invention, a method for controlling a nonvolatile memory device comprising a plurality of memory chips, wherein the nonvolatile memory device stores a plurality of stripes, each stripe comprising a plurality of sub stripes, includes reading a sub stripe including a plurality of sub pages stored in a first memory region of the nonvolatile memory device, determining a number of errors in the sub stripe, performing RAID (redundant array of independent disks) recovery on an erroneous sub page of the sub stripe upon determining that the sub stripe includes one erroneous sub page, setting a recovery fail flag to a spare region of each erroneous sub page of the sub stripe upon determining that the sub stripe has two or more erroneous sub pages, and writing data stored in each valid sub page of the sub stripe to a second memory region different from the first memory region.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
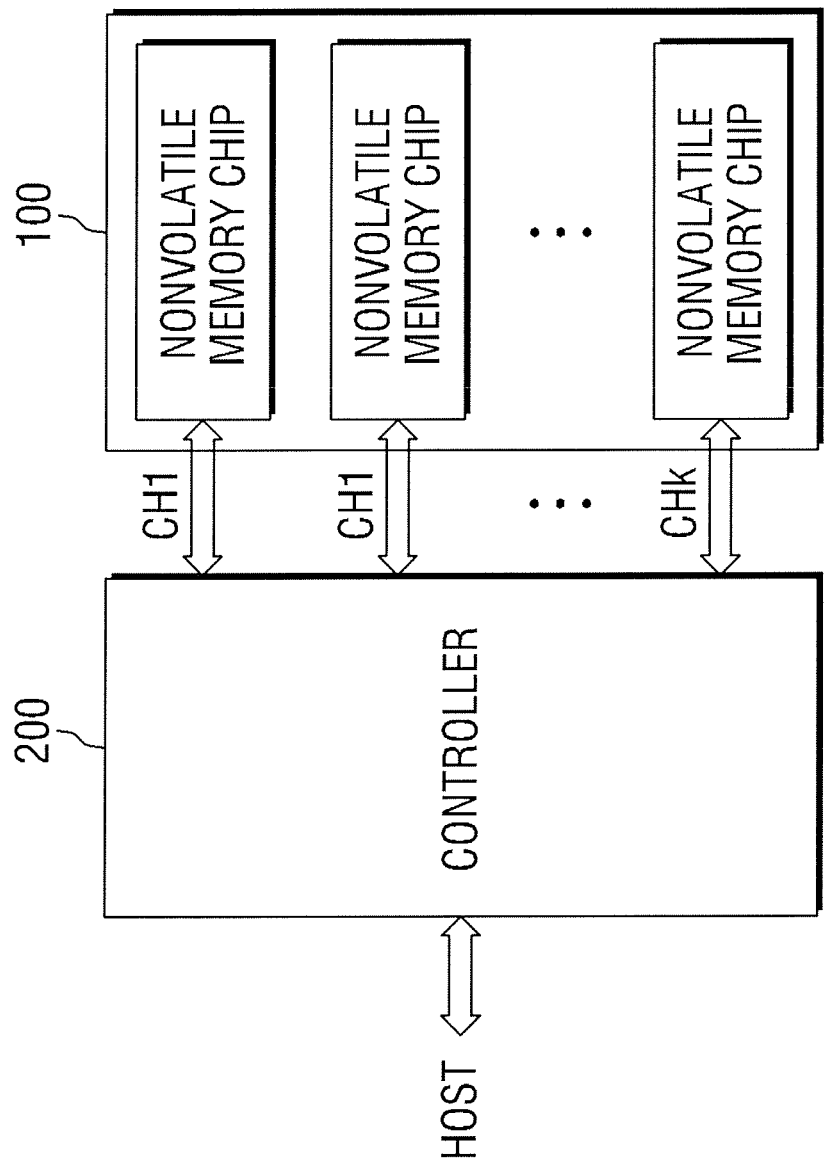
FIG. 1 is a block diagram of a nonvolatile memory system according to an embodiment of the present invention.

The present invention and methods of accomplishing the same may be understood more readily by reference to the following detailed description of exemplary embodiments and the accompanying drawings. The present invention may, however, be embodied in many different forms and should not be construed as being limited to exemplary embodiments set forth herein. Rather, exemplary embodiments are provided so that this disclosure will be thorough and complete and will fully convey the concept of the invention to those skilled in the art, and the present invention will only be defined by the appended claims. In the drawings, the thickness of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

FIG. 1 is a block diagram of a nonvolatile memory system according to an embodiment of the present invention.

Referring to FIG. 1, the nonvolatile memory system includes a nonvolatile memory device 100 and a controller 200.

The nonvolatile memory device 100 may include, for example, a plurality of nonvolatile memory chips. The plurality of nonvolatile memory chips may communicate with the controller 200 through, for example, first to kth channels CH1~CHk.

The controller 200 may be coupled to a host (HOST) and the nonvolatile memory device 100. The controller 200 may be configured to access the nonvolatile memory device 100 in response to a request from the host. For example, the controller 200 may be configured to control read, write, erase and background operations of the nonvolatile memory device 100.

The controller 200 may be configured to provide an interface between the nonvolatile memory device 100 and the host. In addition, the controller 200 may be configured to drive firmware for controlling the nonvolatile memory device 100.

The controller 200 may include, for example, well-known components, including a random access memory (RAM), a processing unit, a host interface, and a memory interface. Here, the RAM may function as an operating memory of the processing unit, a cache memory between the nonvolatile memory device 100 and the host, and/or a buffer memory between the nonvolatile memory device 100 and the host nonvolatile memory device 100. The processing unit may control the operation of the controller 200.

According to an exemplary embodiment, the nonvolatile memory system may include an error correction block (not shown). The error correction block may be configured to detect and correct errors of data read from the nonvolatile memory device 100 using an error correction code (ECC). The error correction block may be provided as a component of the controller 200.

According to an embodiment of the present invention, the controller 200 may perform a RAID recovery technique on the nonvolatile memory device 100. In detail, the controller 200 may perform the RAID recovery on the nonvolatile memory device 100 in units of sub stripes. The RAID recovery may be an external RAID recovery on the nonvolatile memory device 100 in units of sub stripes.

It should be understood that striping, or data striping, is a technique of segmenting logically sequential data. In a data striping operation, accesses of sequential segments of data are made to different storage devices, e.g., different disks of a RAID device. According to an embodiment of the present disclosure, page data may be segmented into sub pages disposed in different storage devices, and the sub pages may be accessed according to a sub stripe technique.

The external RAID recovery technique and error correction code (ECC) technique may be implemented in the memory system according to an embodiment of the present invention, but embodiments of the present invention are not limited thereto. For example, according to an exemplary embodiment of the present invention, an internal RAID recovery technique and error correction code (ECC) technique may be implemented in the memory system. Here, the external RAID technique is a technique of recovering data by storing RAID parity data in one of multiple independent memory chips, and the internal RAID technique is a technique of recovering data by storing RAID parity data in one memory chip.

In addition, a RAID device may have multiple levels. For example, the RAID device may have any one of the following levels: RAID level 0 (striped set without parity or striping); RAID level 1 (mirrored set without parity or mirroring); RAID level 2 (Hamming code parity); RAID level 3 (striped set with dedicated parity, bit interleaved parity, or byte level parity); RAID level 4 (block level parity); RAID level 5 (striped set with distributed parity or interleave parity); RAID level 6 (striped set with dual distributed parity); RAID level 7; RAID level 10; and RAID level 53. Further, the RAID device may include merged RAID levels, the merged RAID level including at least two of the RAID levels given above (e.g., RAID 0+1, RAID 1+0, RAID 5+0, RAID 5+1, or RAID 0+1+5).

Exemplary operations of the controller 200 are described throughout the present disclosure.

The host interface may include a protocol for performing data exchange between the host and the controller 200. For example, the controller 200 may be configured to communicate with the host through one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), IDE (Integrated Drive Electronics), and the like.

According to an exemplary embodiment, the controller 200 and the nonvolatile memory device 100 may be integrated into one device and may be deployed in a memory card. For example, the controller 200 and the nonvolatile memory device 100 may be integrated into one device to constitute a memory card. The memory card may be, for example, a PC card (personal computer memory card international association (PCMCIA) card), a compact flash (CF) card, a smart media card, a memory stick, a multimedia card (e.g., MMC, RS-MMC, and MMCmicro), a secure digital (SD) card (e.g., SD, mini-SD, micro-SD, and SDHC), a universal flash storage (UFS), or the like.

According to an exemplary embodiment, the controller 200 and the nonvolatile memory device 100 may be integrated into one device to constitute a SSD.

When the controller 200 and the nonvolatile memory device 100 are integrated into one semiconductor device to be used as a SSD, an operating speed of the host connected to the nonvolatile memory system can be improved.

According to an exemplary embodiment, the nonvolatile memory system may be applied to computers, ultra mobile personal computers (UMPCs), work stations, net-books, personal digital assistants (PDAs), portable computers, web tablets, wireless phones, mobile phones, smart phones, e-books, portable multimedia players (PMPs), game devices, navigation devices, black boxes, digital cameras, 3-dimensional televisions, digital audio recorders, digital audio players, digital picture players, digital video recorders, digital video players, devices for transmitting/receiving information in wireless environments, one of various electronic devices constituting a home network, one of various electronic devices constituting a computer network, one of various electronic devices constituting a telematics network, an RFID device, one of various components constituting a computing system, etc.

According to an exemplary embodiment, the nonvolatile memory device 100 or the nonvolatile memory system may be mounted using a package. Examples of the package of the nonvolatile memory device 100 or the nonvolatile memory system include a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-level Processed Stack Package (WSP), etc.

Figure 2:
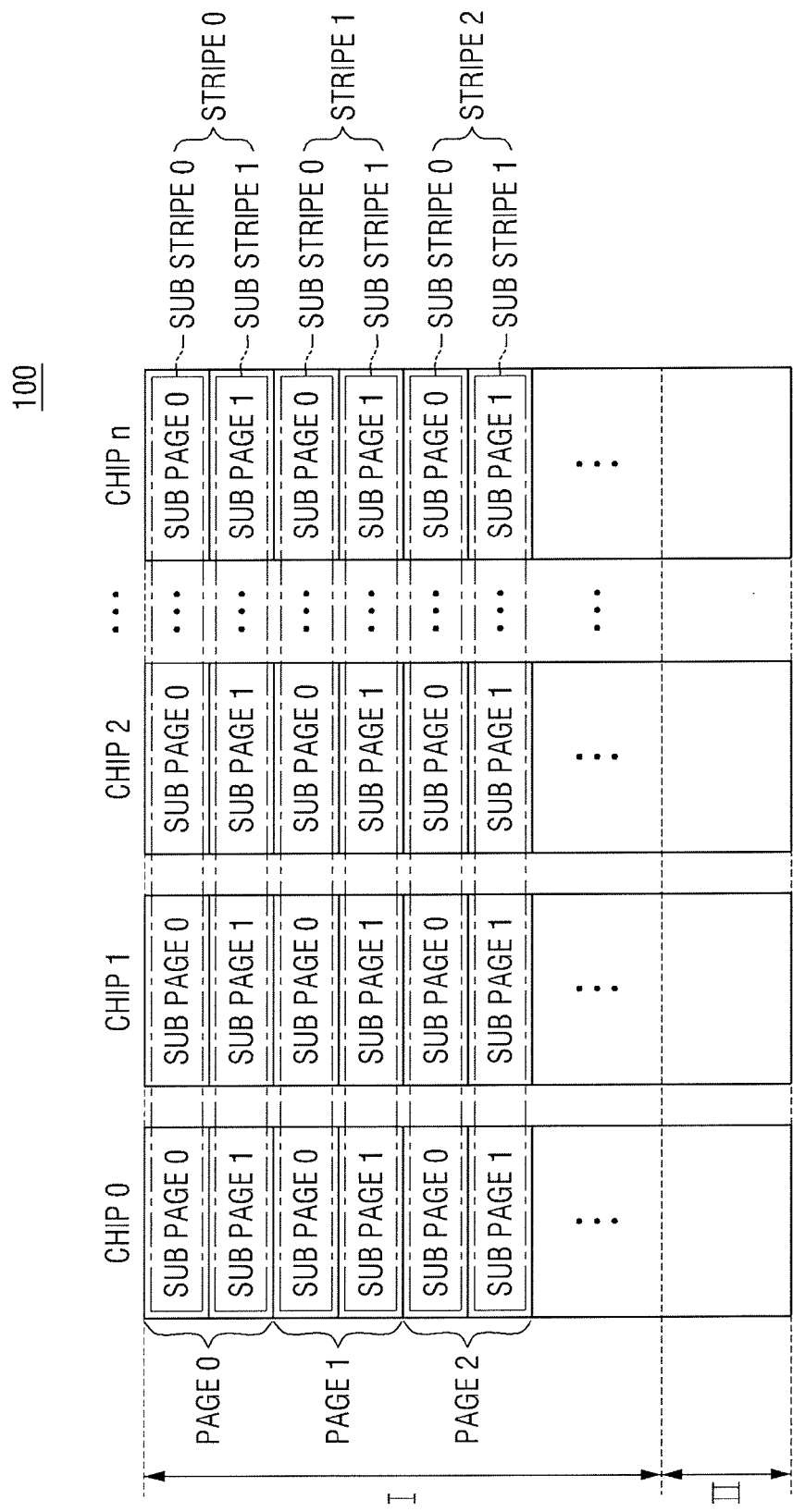
FIG. 2 is a conceptual block diagram of a nonvolatile memory device shown in FIG. 1.
Figure 3:
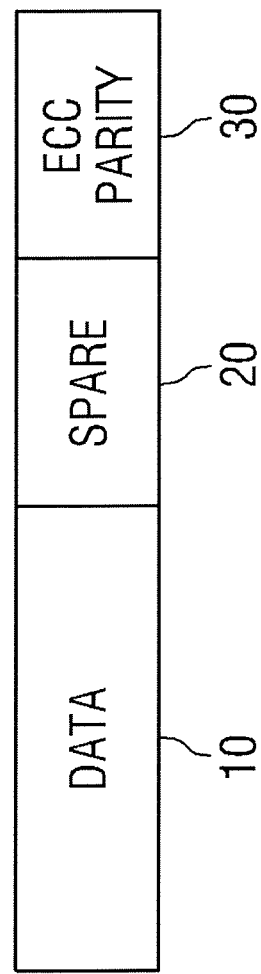
FIG. 3 is a detailed block diagram of a sub page shown in FIG. 2.

FIG. 2 is a conceptual block diagram of a nonvolatile memory device shown in FIG. 1. FIG. 3 is a detailed block diagram of a sub page shown in FIG. 2.

Referring to FIG. 2, the nonvolatile memory device 100 may include a plurality of memory chips CHIP 0 to CHIP n. Each of the plurality of memory chips may include a first region (I) and a second region (II). A plurality of pages storing data may be disposed in the first region (I) of each of the plurality of memory chips, and a plurality of pages storing no data may be disposed in the second region (II) of each of the plurality of memory chips.

According to an exemplary embodiment, one page may include a plurality of sub pages. FIG. 2 illustrates one page including two sub pages, but embodiments of the present invention are not limited hereto. It should be understood that the particularly striping shown in FIG. 2 is merely exemplary, and that the present disclosure is not limited thereto. For example, one page may include more than two sub pages.

The sub pages disposed in different memory chips may constitute a sub stripe. For example, FIG. 2 illustrates sub pages (SUB PAGE 0) disposed at top ends of the respective plurality of memory chips constitute a sub stripe (SUB STRIPE 0). The sub pages included in the sub stripe (SUB STRIPE 0) may be disposed in various manners. For example, the second sub page (SUB PAGE 0) of the first memory chip (CHIP0) and the first sub pages (SUB PAGE 1) of the remaining memory chips (CHIP 1 to CHIP n) may constitute a sub stripe (SUB STRIPE 0).

Further, pages disposed in different memory chips may constitute a stripe (STRIPE). For example, FIG. 2 illustrates pages (PAGE 0) disposed at top ends of the respective plurality of memory chips constitute a stripe (STRIPE 0). The pages included in the stripe (STRIPE 0) may be disposed in various manners.

According to an exemplary embodiment, RAID parity data may be stored in the last memory chip (CHIP n). In detail, each of sub pages of the last memory chip (CHIP n) may store RAID parity data for a corresponding sub page. More particularly, the respective sub pages of the last memory chip (CHIP n) may store XOR-operated RAID parity data corresponding to the data of the corresponding sub pages.

The RAID parity data can be used in performing RAID recovery in units of sub stripes.

The following description will be made on the assumption that the RAID parity data is stored in the last memory chip (CHIP n). It should be understood that embodiments of the present disclosure are not limited thereto. The RAID parity data may be stored at different locations of the respective sub stripes. For example, the RAID parity data of the first sub stripe (SUB STRIPE 0) may be stored in the last memory chip (CHIP n) while the RAID parity data of the second sub stripe (SUB STRIPE 1) may be stored in the first memory chip (CHIP 0). Thus, the scope of the present invention is not limited to exemplary embodiments described herein.

Referring to FIG. 3 again, one sub page may include a data region 10, a spare region 20, and an ECC parity region 30.

Data to be stored in a sub page may be stored in the data region 10 by a host (HOST of FIG. 1). A recovery fail flag may be stored in the spare region 20. ECC parity data generated based on the data stored in the data region 10 may be stored in the ECC parity region 30. The ECC parity data stored in the ECC parity region 30 may be used in recovering data when an error is generated in the data stored in the data region 10. In detail, the error correction block (not shown) included in the nonvolatile memory system (see FIG. 1) may attempt to recover valid data corresponding to data having an error using the ECC parity data stored in the ECC parity region 30 when an error is generated in the data stored in the data region 10.

As described above, one sub page may be an ECC chunk that is the smallest unit in which data errors can be corrected, but embodiments of the present invention are not limited thereto. When needed, a sub page unit can be extended.

Hereinafter, a method for controlling a nonvolatile memory device according to an exemplary embodiment of the present invention will be described with reference to FIGS. 1 and 4 to 6.

Figure 4:
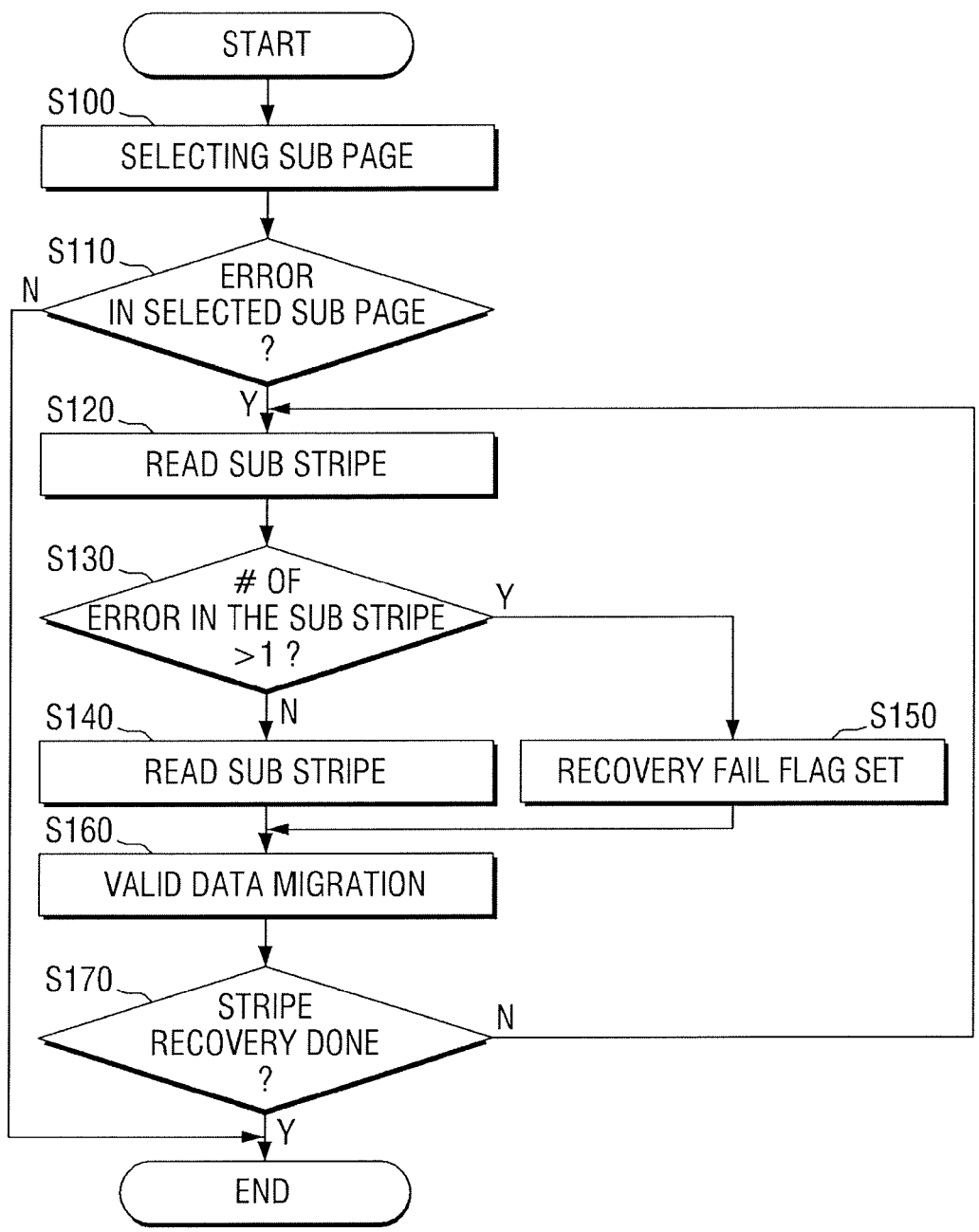
FIG. 4 is a flowchart illustrating a method for controlling a nonvolatile memory device according to an embodiment of the present invention.
Figure 5:
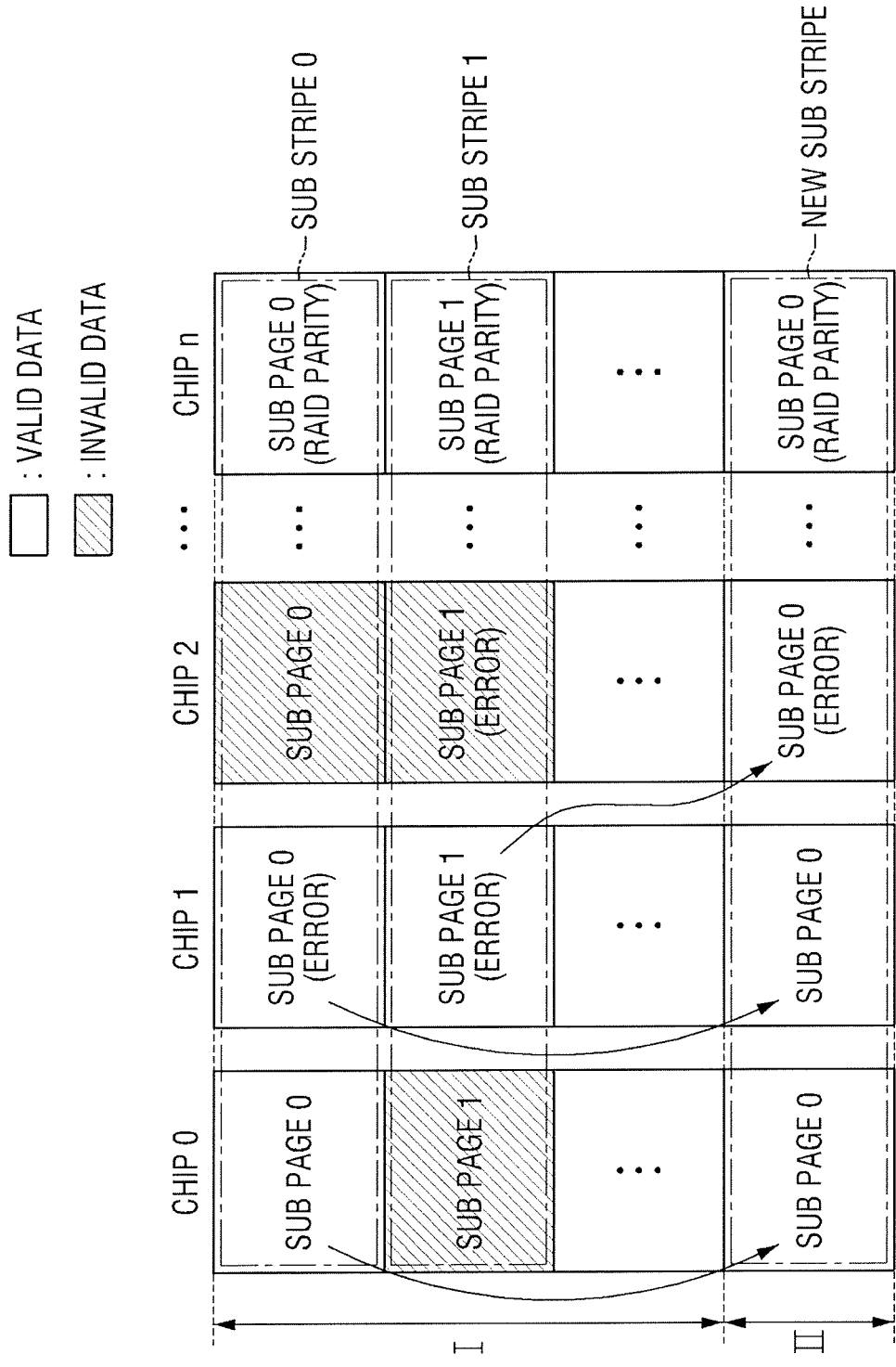
FIGS. 5 and 6 illustrate the method for controlling a nonvolatile memory device according to an embodiment of the present invention
Figure 6:
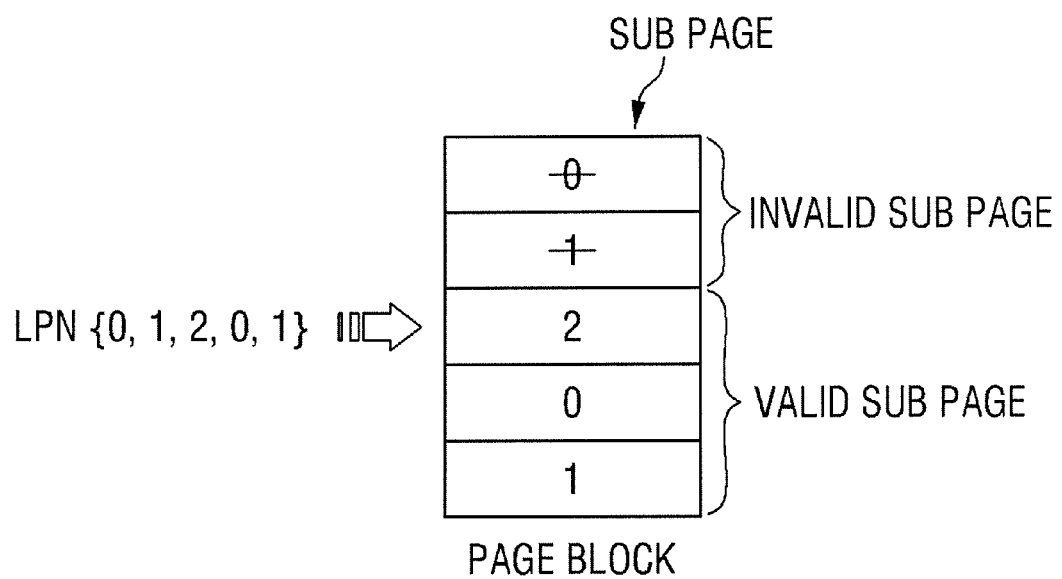

FIG. 4 is a flowchart illustrating a method for controlling a nonvolatile memory device according to an exemplary embodiment of the present invention, and FIGS. 5 and 6 illustrate the method for controlling a nonvolatile memory device according to an controlling embodiment of the present invention.

Referring to FIG. 4, a sub page is selected (S100). In detail, the controller 200 may select a sub page including data requested by the host from among the plurality of memory chips included in the nonvolatile memory device 100.

The method includes determining whether there is an error generated in the data of the selected sub page (S110). In detail, the controller 200 may determine whether there is an error generated in the data stored in the data region 10 (see FIG. 3) of the selected sub page. If it is determined that there is no error, the controller 200 may provide the data stored in the selected sub page to the host. However, if it is determined that there is an error in the data stored in the data region, the error correction block (not shown) of the controller 200 may perform data error recovery using the ECC parity data stored in the ECC parity region 30 (see FIG. 3).

As the result of performing the data error recovery, the error is corrected and the controller 200 may provide the recovered data to the host. If the data is not recovered in spite of the attempt, the controller 200 may perform a RAID recovery.

Referring back to FIG. 4, a sub stripe including a sub page having an error is read to perform the RAID recovery (S120).

In detail, it is assumed that an error exists in the first sub page (SUB PAGE 0) of the second memory chip (CHIP 1) in the nonvolatile memory device 100 shown in FIG. 5. In this case, the controller 200 may read a sub stripe (SUB STRIPE 0) including an erroneous sub page (SUB PAGE 0).

The method further includes determining whether the number of erroneous sub pages in the read sub stripe is smaller than or equal to 1 or greater than or equal to 2 (S130). If the number of erroneous sub pages in the read sub stripe is smaller than or equal to 1, the RAID recovery may be performed on the read sub stripe (S140). If the number of erroneous sub pages in the read sub stripe is greater than or equal to 2, a recovery fail flag is set for the erroneous sub page (S150).

In the example of FIG. 5, the number of sub pages having errors (SUB PAGE 0) in the sub stripe (SUB STRIPE 0) is equal to 1. In the case of 1 error, the controller 200 may recover the data of the erroneous sub page (SUB PAGE 0) using the RAID parity data stored in the last memory chip (CHIP n). According to an exemplary embodiment, the controller 200 may perform the RAID recovery in units of sub pages (that is, sub pages or ECC chunks).

The data stored in a valid sub page in the read sub stripe is migrated (S160).

Before describing the data migration in detail, concepts of a valid sub page and an invalid sub page will be described with reference to FIG. 6.

For purposes of explanation, assume that data corresponding to logic pages 0, 1, 2, 0 and 1 are sequentially input from a host to a memory device (PAGE BLOCK), data is stored in each sub page (SUB PAGE) of the memory device (PAGE BLOCK), as shown in FIG. 6. That is to say, the data corresponding to logic page 0 is first stored in the first sub page, updated by the same data that is input later and then newly stored in the fourth sub page. In addition, the data corresponding to logic page 1 is first stored in the second sub page, updated by the same data that is input later and then newly stored in the fifth sub page. The data corresponding to logic page 2 is stored in the third sub page without being updated.

Here, since the data of the first and second sub pages have been updated, they may not be used until the first and second sub pages are initialized by garbage collection, etc., and the data of the third to fifth sub pages may be used later.

Throughout the disclosure of the present invention, a sub page including data that will not be used any longer until the sub page is initialized, such as the first sub page or the second sub page shown in FIG. 6, is defined as an invalid sub page, and a sub page including data that will be used later when the sub page is initialized, such as the third to fifth sub pages shown in FIG. 5, is defined as a valid sub page.

In the example of FIG. 5, the valid sub pages in the read sub stripe (SUB STRIPE 0) are the first sub page (SUB PAGE 0) of the first memory chip (CHIP 0) and the first sub page (SUB PAGE 0) of the second memory chip (CHIP 1). Therefore, the controller 200 migrates the valid sub pages stored in the first region (I) of each memory chip to the second region (II). That is to say, the data included in the valid sub pages are written to the second region (II) of the memory chips.

Referring again to FIG. 5, RAID recovery is performed on the first sub page (SUB PAGE 0) of the second memory chip (CHIP 1) to write the recovered valid data to the second region (II) of the second memory chip (CHIP 1). In other words, the sub page stored in the second regions (II) of the second memory chip (CHIP 1) may be an error-recovered sub page.

As described above, according to an exemplary embodiment, the data stored in the valid sub pages in the read sub stripe are migrated to other regions of the memory chips, which may prevent the error from repeatedly occurring. In general, a data error occurring in a particular sub page may be caused due to deterioration of a particular memory cell included in the corresponding memory chip and storing the data of the sub page or interference between the particular memory cell and another memory cell. Therefore, if the error-corrected sub page data is stored in the memory cell experiencing deterioration or interference by another memory cell, there may be an increased possibility of generating errors. According to an exemplary embodiment, the RAID recovery is performed and only the data of the valid sub page is written to another region of the memory chip.

Referring to FIG. 4 again, the method may include determining whether recovery of a stripe including sub stripes is complete (S170). If the stripe recovery is not complete, the above-described method of blocks S120 to S160 may be repeated.

In the example shown in FIG. 5, one stripe includes two sub stripes (SUB STRIPE 0 and SUB STRIPE 1). That is to say, the stripe recovery is not complete. In this case, the controller 200 may read the second sub stripe (SUB STRIPE 1).

Unlike the first sub stripe (SUB STRIPE 0), the second sub stripe (SUB STRIPE 1) includes two erroneous sub pages. That is, the second sub page (SUB PAGE 1) of the second memory chip (CHIP 1) and the second sub page (SUB PAGE 1) of the third memory chip (CHIP 2) each include an error. RAID recovery cannot be performed on the second sub stripe (SUB STRIPE 1). Therefore, the controller 200 does not perform the RAID recovery on the second sub stripe (SUB STRIPE 1). Here, the controller 200 may set a recovery fail flag to the spare region (20 of FIG. 3) of the erroneous sub page.

The valid sub page included in the second sub stripe (SUB STRIPE 1) is the second sub page (SUB PAGE 1) of the second memory chip (CHIP 1). Therefore, the controller 200 may write the data included in the valid sub page to the second region (II) of the memory chips.

Here, the data written to the second region (II) is data having an error, on which RAID recovery is not performed. That is to say, the sub page stored in the second region (II) of the third memory chip (CHIP 2) may be an erroneous sub page. However, a recovery fail flag is set to the spare region 20 (see FIG. 3) of the sub page. Therefore, the controller 200 is able to determine in advance that the data in the sub page has an error. If the sub page is selected, the controller 200 may send an error message to the host.

As described above, if a new sub stripe is the result of sub page migration, the sub page disposed in the second region (II) of the last memory chip (CHIP n) may store RAID parity data of the new sub stripe.

As described above, in a method for controlling the non-volatile memory device according to an exemplary embodiment of the present invention, RAID recovery is performed on a sub stripe consisting of sub pages. In a system in which a sub stripe is stored including sub pages, data can be recovered even in a case where data errors exist in two or more pages.

Referring to the example shown in FIG. 5, it may be assumed that errors exist only in the first sub page (SUB PAGE 0) of the second memory chip (CHIP 1) and the second sub page (SUB PAGE 1) of the third memory chip (CHIP 2). In a case where RAID recovery may only be performed on a stripe-by-stripe basis, the RAID recovery cannot be performed on the pages included in the second memory chip (CHIP 1) and the third memory chip (CHIP 2). According to an exemplary embodiment of the present invention, RAID recovery may be performed in units of sub stripes, where RAID recovery may be performed on both the first sub stripe (SUB STRIPE 0) and the second sub stripe (SUB STRIPE 1).

In addition, according to an exemplary embodiment, the data stored in the valid sub page in the sub stripe on which RAID recovery has been performed may be migrated to another region of the memory chip. Therefore, a possibility of generating the same data error is reduced.

Hereinafter, a method for controlling a nonvolatile memory device according to an exemplary embodiment of the present invention will be described with reference to FIG. 7.

Figure 7:
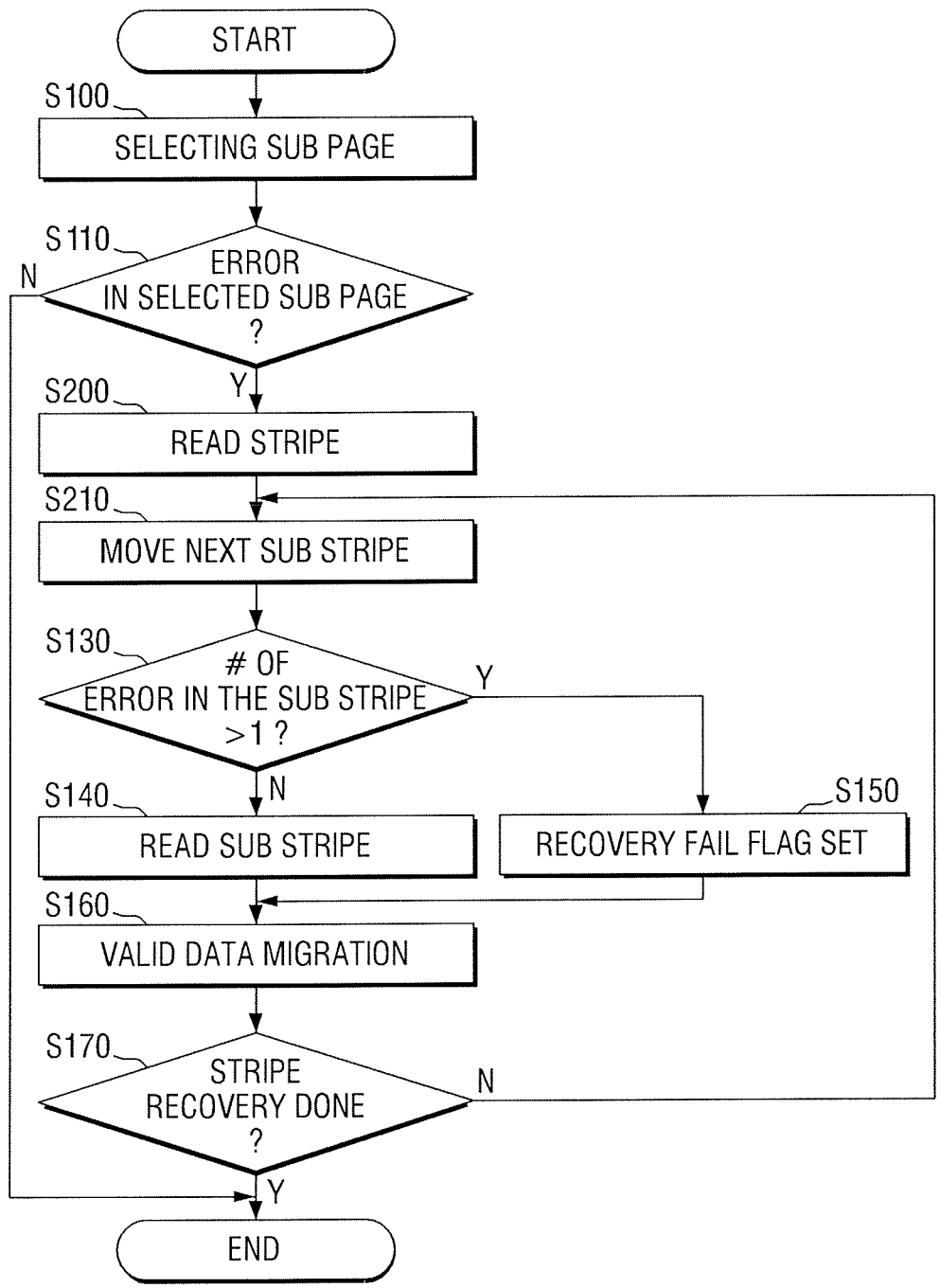
FIG. 7 is a flowchart illustrating a method for controlling a nonvolatile memory device according to an embodiment of the present invention.

FIG. 7 is a flowchart illustrating a method for controlling a nonvolatile memory device according to an exemplary embodiment of the present invention. A description of features or elements previously described herein may not be repeated.

Referring to FIG. 7, in the method for controlling a nonvolatile memory device according to an exemplary embodiment of the present invention, when a sub stripe including erroneous sub pages is read, all sub stripes included in the stripe are read simultaneously (S200).

In the example shown in FIG. 5, the controller 200 reads the first sub stripe (SUB STRIPE 0) and RAID recovery and data migration are performed to read the second sub stripe (SUB STRIPE 1). According to an exemplary embodiment, the controller 200 reads both the first sub stripe (SUB STRIPE 0) and the second sub stripe (SUB STRIPE 1) (S200), and RAID recovery and data migration are performed sequentially on the respective sub stripes (S210).

In an environment in which the controller 200 reads the data stored in the nonvolatile memory device 100 on a page-by-page basis, the operating time can be reduced according to an exemplary embodiment of the present invention.

Hereinafter, a method for controlling a nonvolatile memory device according to an exemplary embodiment of the present invention will be described with reference to FIG. 8.

Figure 8:
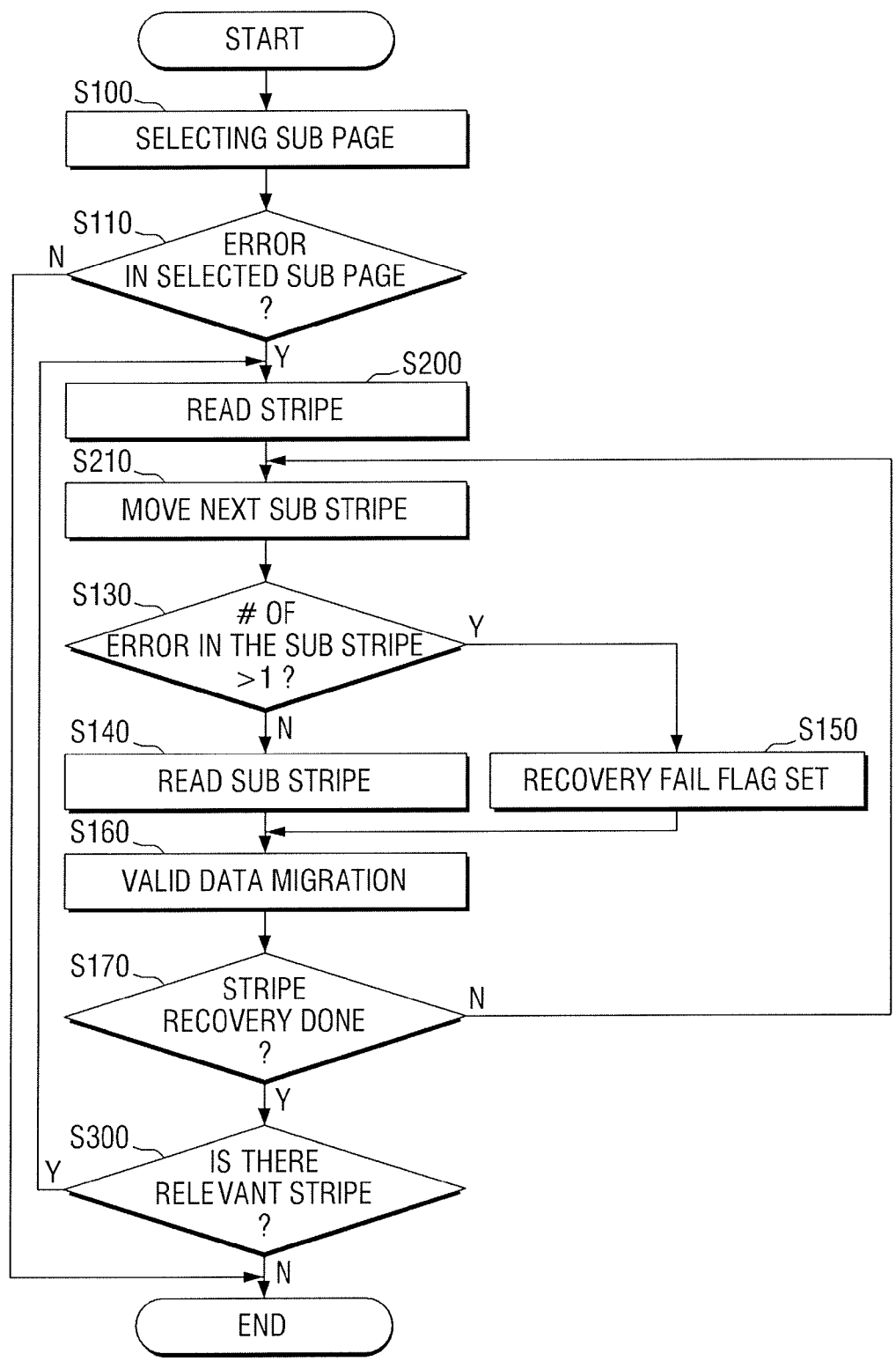
FIG. 8 is a flowchart illustrating a method for controlling a nonvolatile memory device according to an embodiment of the present invention.

FIG. 8 is a flowchart illustrating a method for controlling a nonvolatile memory device according to an exemplary embodiment of the present invention. A description of features or elements previously described herein may not be repeated.

Referring to FIG. 8, stripe recovery may be performed on the stripe including a read sub stripe (S170), and it is determined whether stripe recovery is done on a relevant stripe (S300).

Here, the relevant stripe may mean strips related to a physical memory cell. In detail, stripes including pages sharing data stored in a physical memory cell may be related to one another.

For example, referring to FIG. 2, it may be assumed that first to third pages (PAGE 0 to PAGE 2) of the first memory chip (CHIP 0) are pages sharing data stored in one physical memory cell. For example, 3-bit data may be stored in a physical memory cell. Specifically, Least Significant Bit (LSB) bit data may be stored in the first (PAGE 0), Central Significant Bit (CSB) bit data may be stored in the second page (PAGE 1), and Most Significant Bit (MSB) bit data may be stored in the third page (PAGE 2).

As described above, RAID recovery may be performed on the pages sharing the data stored in one physical memory cell at the same time, thereby facilitating a reliable device. According to an exemplary embodiment, RAID recovery may be performed on all relevant stripes, In particular, RAID recovery may be performed on all relevant stripes disposed in the same block.

A computing system according to an exemplary embodiment of the present invention will be described with reference to FIG. 9.

Figure 9:
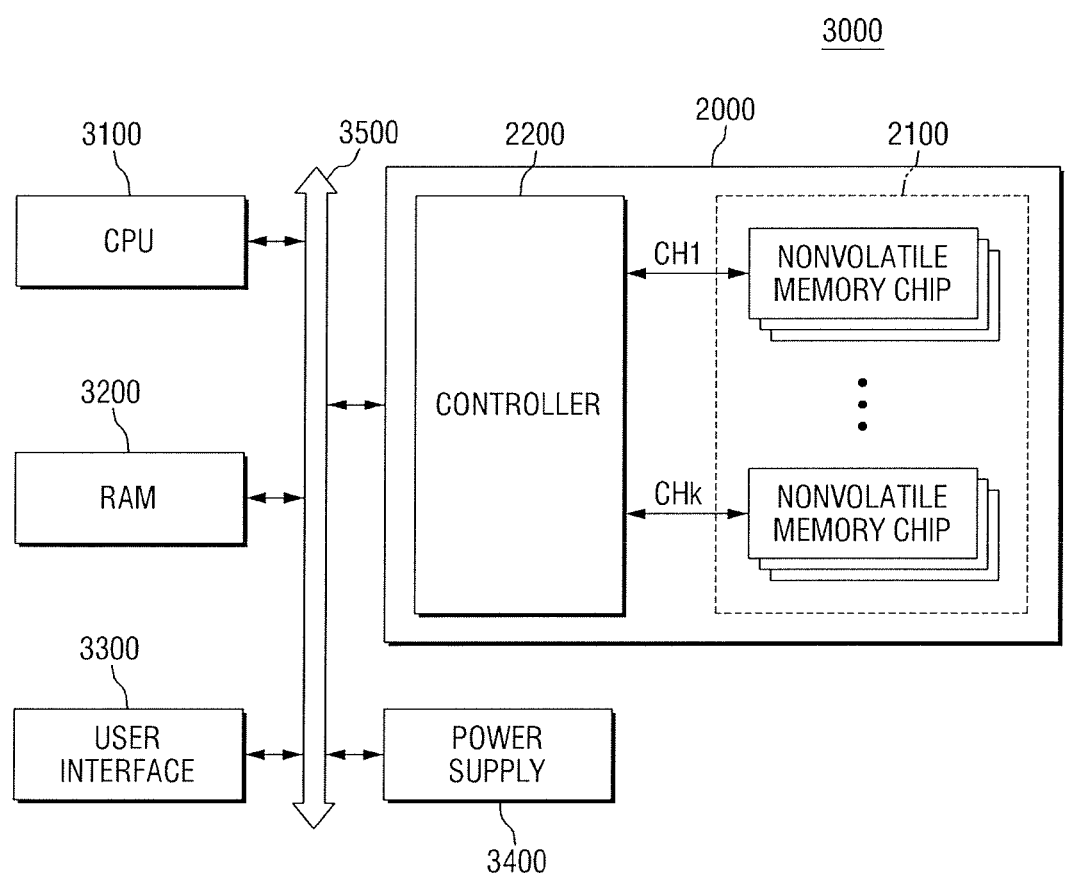
FIG. 9 is a block diagram of a computing system according to an embodiment of the present invention.

FIG. 9 is a block diagram of a computing system according to an exemplary embodiment of the present invention.

Referring to FIG. 9, the computing system 3000 may include a central processing unit (CPU) 3100, a RAM 3200, a user interface 3300, a power supply device 3400 and a memory system 2000.

Here, the memory system 2000 may be a system of controlling the nonvolatile memory device 2100 through the controller 2200 according an exemplary embodiment of the present invention. The memory system 2000 may be electrically connected to the CPU 3100, the RAM 3200, the user interface 3300 and the power supply device 3400 through a system bus 3500. The data provided through the user interface 3300 or the data processed by the CPU 3100 may be stored in the memory system 2000.

While FIG. 9 illustrates that the nonvolatile memory device 2100 is connected to the system bus 3500 through the controller 2200, the nonvolatile memory device 2100 may be configured to be directly connected to the system bus 3500 in the computing system according to an exemplary embodiment of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that exemplary embodiments be considered in all respects as illustrative and not restrictive, reference being made to the appended claims rather than the foregoing description to indicate the scope of the invention.

What is claimed is:

1. A method for controlling a nonvolatile memory device when data is not recovered in a data error recovery operation, the method comprising:
    (a) simultaneously reading all substripes of a stripe stored in a first memory region that includes a first sub stripe including an erroneous sub page, wherein a stripe includes a plurality of pages in the first memory region and each page in the stripe includes two or more sub pages;
    (b) determining whether a number of erroneous subpages in a first substripe of the stripe is less than or equal to 1,
    (c) performing a RAID recovery on the first substripe, if the number of erroneous subpages in the first substripe of the stripe is less than or equal to 1; and
    (d) migrating data in a valid sub-page of the first substripe.

2. The method of claim 1, wherein performing a RAID recovery on the first substripe comprises recovering the data of the erroneous sub page using RAID parity data.

3. The method of claim 2, wherein recovering the data of the erroneous sub page further comprises writing recovered valid data to a second region.

4. The method of claim 1, further comprising setting a recovery fail flag to a spare region of an erroneous sub page of the first sub stripe if the first sub stripe has two or more erroneous sub pages.

5. The method of claim 1, further comprising, after migrating data in a valid sub-page of the first substripe, selecting a next substripe of the stripe, and repeating steps (b), (c), and (d) on the next substripe.

6. The method of claim 5, further comprising performing stripe recover on a relevant stripe, wherein a relevant stripe includes those pages that share data in a physical memory cell.

7. The method of claim 1, wherein the nonvolatile memory device includes a plurality of memory chips and each of the plurality of sub pages is stored in a memory chip of the plurality of different memory chips.

8. The method of claim 7, wherein each of the plurality of memory chips stores at least one page including a plurality of sub pages,
wherein each of the pages is stored in each of the plurality of different memory chips to constitute a respective stripe.

9. The method of claim 4, wherein erroneous data is written to the second region, and the recovery fail flag enables a controller to determine that the data written to the second region is erroneous.

10. The method of claim 1, further comprising, before simultaneously reading all substripes of a stripe stored in a first memory region,
selecting a subpage that includes data requested by a host from a memory chip of a non-volatile memory device,
determining that an error was generated in the data of the selected sub page, and
performing a data error recovery operation using the ECC parity data.

11. The method of claim 1, wherein the sub pages are error correction code (ECC) chunks including a data region, a spare region, and an ECC parity region.

12. A nonvolatile memory system comprising:
a plurality of memory chips, each memory chip including a first region and a second region, and each region storing a plurality of pages; and
a controller coupled to the plurality of memory chips,
wherein the pages include a plurality of error correction code (ECC) chunks, and when data is not recovered in a data error recovery operation, the controller is configured to
(a) simultaneoulsy read all substripes of a stripe stored in the memory region that includes an erroneous sub page, wherein a stripe includes a plurality of pages in the first memory region and each page in the stripe includes two or more sub pages,
(b) determine whether a number of erroneous subpages in a first substripe of the stripe is less than or equal to 1,
(c) perform a RAID recovery on the first substripe, if the number of erroneous subpages in the first substripe of the stripe is less than or equal to 1; and
(d) migrate data in a valid sub-page of the first substripe.

13. The nonvolatile memory system of claim 12, wherein each of the ECC chunks includes a data region, a spare region, and an ECC parity region.

14. The nonvolatile memory system of claim 13 wherein the controller performs RAID recovery on the first substripe comprises by recovering the data of the erroneous sub page using RAID parity data.

15. The nonvolatile memory system of claim 14, wherein the controller recovers the data of the erroneous sub page further comprises writing recovered valid data to a second and
sets a recovery fail flag to the spare region of each erroneous ECC chunk upon determining that the first sub stripe includes two or more erroneous ECC chunks.

16. The nonvolatile memory system of claim 15,
wherein erroneous data is written to the second region, and the recovery fail flag enables a controller to determine that the data written to the second region is erroneous.

17. The method of claim 12, wherein the controller generates parity data using the data written to the second memory region,
wherein the data written to the second memory region constitutes a new sub stripe.

18. The method of claim 12, further comprising iterating the method for each sub stripe of a selected page.

* * * * *